US012677648B2

(12) United States Patent
Yang et al.

(10) Patent No.: US 12,677,648 B2
(45) Date of Patent: Jul. 7, 2026

(54) TREATMENT OF TUNGSTEN SURFACE FOR TUNGSTEN GAP-FILL

(71) Applicant: Applied Materials, Inc., Santa Clara, CA (US)

(72) Inventors: Tsung-Han Yang, San Jose, CA (US); Xingyao Gao, Santa Jose, CA (US); Shiyu Yue, Santa Clara, CA (US); Chih-Hsun Hsu, Santa Clara, CA (US); Shirish Pethe, Cupertino, CA (US); Rongjun Wang, Dublin, CA (US); Yi Xu, San Jose, CA (US); Wei Lei, Santa Clara, CA (US); Yu Lei, Belmont, CA (US); Aixi Zhang, Santa Clara, CA (US); Xianyuan Zhao, Santa Clara, CA (US); Zhimin Qi, Santa Clara, CA (US); Jiang Lu, Milpitas, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 501 days.

(21) Appl. No.: 18/133,102

(22) Filed: Apr. 11, 2023

(65) Prior Publication Data

US 2023/0420295 A1       Dec. 28, 2023

Related U.S. Application Data

(60) Provisional application No. 63/354,354, filed on Jun. 22, 2022.

(51) Int. Cl.
*H10W 20/00*       (2026.01)
*H01J 37/32*       (2006.01)
*H10P 14/44*       (2026.01)

(52) U.S. Cl.
CPC ..... *H10W 20/056* (2026.01); *H01J 37/32899* (2013.01); *H10P 14/44* (2026.01);
(Continued)

(58) Field of Classification Search
None
See application file for complete search history.

(56) References Cited

U.S. PATENT DOCUMENTS 6,271,129 B1    8/2001  Ghanayem et al.
7,592,256 B2    9/2009  Okubo et al.
(Continued)

FOREIGN PATENT DOCUMENTS

KR    20060018323 A    3/2006
KR    20210089260 A    7/2021
WO     2020118100 A1    6/2020

OTHER PUBLICATIONS

Office Action for Korean Application No. 10-2025-7001743 dated Jul. 22, 2025.
(Continued)

*Primary Examiner* — Bradley Smith
(74) *Attorney, Agent, or Firm* — Patterson + Sheridan, LLP

(57)       ABSTRACT

A method and apparatus for tungsten gap-fill in semiconductor devices are provided. The method includes performing a gradient oxidation process to oxidize exposed portions of a liner layer, wherein the gradient oxidation process preferentially oxidizes an overhang portion of the liner layer, which obstructs or blocks top openings of one or more features formed within a field region of a substrate. The method further includes performing an etchback process to remove or reduce the oxidized overhang portion of the liner layer, exposing the liner layer to a chemical vapor transport (CVT) process to remove metal oxide remaining from the
(Continued)

gradient oxidation process and the etchback process, and performing a tungsten gap-fill process to fill or partially fill the one or more features.

20 Claims, 5 Drawing Sheets

(52) U.S. Cl.
CPC ....... *H10W 20/033* (2026.01); *H10W 20/045* (2026.01); *H10W 20/048* (2026.01); *H10W 20/052* (2026.01); *H10W 20/054* (2026.01); *H01J 2237/338* (2013.01)

(56) References Cited

U.S. PATENT DOCUMENTS

| | | | |
|---|---|---|---|
| 7,776,698 | B2 | 8/2010 | Ye et al. |
| 8,071,478 | B2 | 12/2011 | Wu et al. |
| 9,082,826 | B2 | 7/2015 | Chandrashekar et al. |
| 9,169,556 | B2 | 10/2015 | Wu et al. |
| 9,748,105 | B2 | 8/2017 | Wu et al. |
| 10,680,008 | B2 | 6/2020 | Lee et al. |
| 10,879,114 | B1 | 12/2020 | Wu et al. |
| 11,177,387 | B2 | 11/2021 | Chen et al. |
| 11,978,666 | B2 | 5/2024 | Chandrashekar et al. |
| 2005/0032364 | A1 | 2/2005 | Okubo et al. |
| 2007/0117397 | A1 | 5/2007 | Fu et al. |
| 2010/0167527 | A1 | 7/2010 | Wu et al. |
| 2013/0012032 | A1 | 1/2013 | Liu et al. |
| 2013/0109164 | A1 | 5/2013 | Olsen et al. |
| 2013/0122713 | A1 | 5/2013 | Rogers et al. |
| 2013/0171822 | A1* | 7/2013 | Chandrashekar ....... C23C 16/04 118/696 |
| 2014/0106083 | A1 | 4/2014 | Wu et al. |
| 2014/0120700 | A1 | 5/2014 | Wang et al. |
| 2016/0314981 | A1* | 10/2016 | Yoon ................. H01L 21/32136 |
| 2018/0323103 | A1 | 11/2018 | Shaviv et al. |
| 2019/0122923 | A1 | 4/2019 | Wang et al. |
| 2019/0148397 | A1 | 5/2019 | Lee et al. |
| 2019/0172723 | A1 | 6/2019 | Cheng et al. |
| 2019/0206731 | A1 | 7/2019 | Chandrashekar et al. |
| 2020/0312673 | A1* | 10/2020 | Tsai ................. H01L 21/32138 |
| 2021/0066466 | A1* | 3/2021 | Kwon ................. H10D 64/687 |
| 2021/0134952 | A1 | 5/2021 | Fung |
| 2021/0305059 | A1 | 9/2021 | Lai et al. |
| 2021/0320034 | A1 | 10/2021 | Lei et al. |
| 2021/0351136 | A1 | 11/2021 | Shen et al. |
| 2022/0020641 | A1 | 1/2022 | Chandrashekar et al. |
| 2022/0098731 | A1 | 3/2022 | Wu et al. |
| 2022/0130659 | A1* | 4/2022 | Wang .................... H01L 21/321 |
| 2022/0165580 | A1* | 5/2022 | Cui .................... H01L 21/02063 |
| 2022/0181201 | A1 | 6/2022 | Xu et al. |
| 2022/0359279 | A1 | 11/2022 | Cen et al. |
| 2024/0234208 | A1 | 7/2024 | Chandrashekar et al. |

OTHER PUBLICATIONS

International Opinion and Search Report dated Jul. 31, 2023 for International Application No. PCT/US2023/018108.

* cited by examiner

100

110
PROVIDE SUBSTRATE HAVING FEATURE FORMED THEREIN

120
DEPOSIT LINER LAYER OVER FEATURE

130
OPTIONAL NUCLEATION LAYER

140
GRADIENT OXIDATION AND ETCH BACK

150
POST-ETCH TREATMENT

160
FILL FEATURE WITH TUNGSTEN

1

TREATMENT OF TUNGSTEN SURFACE FOR TUNGSTEN GAP-FILL

CROSS-REFERENCE TO RELATED APPLICATIONS

This application claims the benefit of U.S. Provisional Patent Application Ser. No. 63/354,354, filed Jun. 22, 2022, which is incorporated by reference herein in its entirety.

TECHNICAL FIELD

The present disclosure relates to a method and apparatus for forming thin-films. More particularly, the disclosure relates to a method and apparatus for tungsten gap-fill in semiconductor devices.

BACKGROUND

The fabrication of microelectronic devices typically involves a complicated process sequence requiring hundreds of individual processes performed on semi-conductive, dielectric and conductive substrates. Examples of these processes include oxidation, diffusion, ion implantation, thin film deposition, cleaning, etching, lithography among other operations. Each operation is time consuming and expensive.

With ever-decreasing critical dimensions for microelectronic devices, the design and fabrication for these devices on substrates become increasingly complex. Control of the critical dimensions and process uniformity becomes increasingly more significant. Complex multilayer stacks involve precise process monitoring of the critical dimensions for the thickness, roughness, stress, density, and potential defects. Multiple incremental processes in the process recipes for forming the devices ensure critical dimensions are maintained. However, each recipe process may utilize one or more processing chambers that add additional time for forming the devices in the processing systems and also provides additional opportunities for forming defects. Thus, each process adds to the overall fabrication cost for the completed microelectronic devices.

Additionally, as critical dimensions on these devices shrink, past fabrication techniques encounter new hurdles. For example, as a liner and/or nucleation layer is prepared to grow a metal gap-fill, the liner and/or nucleation layer may be still be present on the sides of the gap causing the fill material to close off the gap prior to completely filling resulting in seams in the fill material.

For at least the foregoing reasons, there is an ongoing need for improved fabrication methods to minimize cost while maintaining critical dimensions for microelectronic devices.

SUMMARY

The present disclosure relates to a method and apparatus for forming thin-films. More particularly, the disclosure relates to a method and apparatus for tungsten gap-fill in semiconductor devices.

In one aspect, a method of filling a feature on a substrate is provided. The method includes performing a gradient oxidation process to oxidize exposed portions of a liner layer, wherein the gradient oxidation process preferentially oxidizes an overhang portion of the liner layer, which obstructs or blocks top openings of one or more features formed within a field region of a substrate. The method further includes performing an etchback process to remove or reduce the oxidized overhang portion of the liner layer, exposing the liner layer to a chemical vapor transport (CVT) process to remove metal oxide remaining from the gradient oxidation process and the etchback process, and performing a tungsten gap-fill process to fill or partially fill the one or more features.

Implementations may include one or more of the following. The liner layer is a tungsten-containing layer and the metal oxide is tungsten oxide. The CVT process is a plasma process that reduces the tungsten oxide to tungsten. The CVT process includes exposing the tungsten-containing layer to an inductively coupled plasma (ICP) comprising hydrogen and oxygen. Exposing the tungsten-containing layer to an ICP is performed at a temperature of 400 degrees Celsius or less and includes supplying a processing gas comprising greater than or equal to 90% of hydrogen gas of a total flow of hydrogen gas and oxygen gas. Performing the gradient oxidation process, performing the etchback process, and exposing the liner layer to the CVT process are performed in a processing chamber without breaking vacuum. The one or more features include a bottom surface and at least one sidewall and the liner layer is formed over the at least one sidewall and the bottom surface.

In another aspect, a method of filling a feature formed on a substrate is provided. The method includes depositing one or more tungsten-containing layers over a surface of a substrate. The substrate includes a plurality of features formed within a field region of the surface of the substrate, each of the plurality of features includes a sidewall surface and a bottom surface, and the deposited one or more tungsten-containing layers are formed over the field region, sidewall surface, and bottom surface of the plurality of features. The method further includes exposing the surface of the substrate to a gradient oxidizing process, wherein the gradient oxidizing process forms preferentially oxidized regions of the tungsten-containing layers that are disposed over the field region of the plurality of features. The method further includes preferentially etching the preferentially oxidized regions of the deposited one or more tungsten-containing layers formed on the surface of the substrate. After performing the process of preferentially etching the preferentially oxidized regions, a first portion of the deposited one or more tungsten-containing layers remains on the bottom surface of each of the plurality of features and a second portion of the deposited one or more tungsten-containing layers remains on the sidewall surface of each of the plurality of features. The method further includes exposing at least the second portion of the deposited one or more tungsten containing layers to a post-etch treatment process to reduce oxidized tungsten to tungsten and remove contaminants from surfaces of the deposited one or more tungsten-containing layers. The method further includes filling the features with a second tungsten layer. The process of filling the features with the second tungsten layer includes preferentially growing the second tungsten layer from the second portion of the deposited one or more tungsten-containing layers on the sidewall surface and the first portion of the deposited one or more tungsten-containing layers that remain on the bottom surface of each of the features.

Implementations may include one or more of the following. The post-etch treatment process includes an inductively coupled plasma. The post-etch treatment process further includes exposing the tungsten-containing layers to one or more of H2, O2, Ar, or a combination thereof. The post-etch treatment process includes exposing the tungsten-containing layers to a hydrogen and oxygen plasma treatment. The hydrogen and oxygen plasma treatment is performed at temperatures of 400 degrees Celsius or less and includes supplying a processing gas comprising greater than or equal to 90% of hydrogen gas of a total flow of hydrogen gas and oxygen gas. The sidewall surface is defined by a dielectric material selected from silicon oxide, silicon nitride, silicon oxynitride, or a combination thereof. Depositing the one or more tungsten-containing layers over the surface of the substrate includes depositing a tungsten liner layer over the plurality of features via a physical vapor deposition process and depositing a boron-tungsten nucleation layer over the tungsten liner layer via an atomic layer deposition (ALD) process. Filling the features with the second tungsten layer includes a chemical vapor deposition (CVD) gap-fill process. The post-etch treatment process includes a chemical vapor transport (CVT) process. The CVT process includes a volatilization process and a reduction process. The volatilization process proceeds via the following reaction (I) $WO_2 + 2H_2O \rightarrow WO_2(OH)_2 + H_2$ and the reduction process proceeds via the following reaction (II) $WO_2(OH)_2 + 3H_2 \rightarrow W + 4H_2O$. Exposing the surface of the substrate to a gradient oxidizing process, preferentially etching the preferentially oxidized regions of the deposited one or more tungsten-containing layers formed on the surface of the substrate, and exposing at least the second portion of the deposited one or more tungsten-containing layers to a post-etch treatment process are performed in a first process chamber disposed on a cluster tool.

In yet another embodiment, a cluster tool is provided. The cluster tool includes a first process chamber. The first process chamber includes an oxygen source that is fluidly coupled to a processing region of the first process chamber, wherein the oxygen source is configured to deliver an oxygen-containing gas to the processing region. The first process chamber includes a first flow control valve that is configured to control the flow of oxygen-containing gas provided from the oxygen source to the processing region. The first process chamber further includes a hydrogen source that is fluidly coupled to the processing region of the first process chamber, wherein the hydrogen source is configured to deliver a hydrogen-containing gas to the processing region. The first process chamber further includes a second flow control valve that is configured to control the flow of the hydrogen-containing gas provided from the hydrogen source to the processing region. The first process chamber further includes an etching gas source that is fluidly coupled to the processing region of the first process chamber, wherein the etching gas source is configured to deliver an etching gas to the processing region. The first process chamber further includes a third flow control valve that is configured to control the flow of the etching gas provided from the etching gas source to the processing region. The first process chamber further includes an inductively coupled plasma source that is configured to generate a plasma in the processing region, wherein the plasma comprises the hydrogen-containing gas and the oxygen-containing gas. The cluster tool further includes a controller. The controller is configured to control the first flow control valve so that an amount of oxygen-containing gas provided to a surface of a substrate, disposed in the processing region of the first processing chamber, to preferentially oxidize one or more tungsten-containing layers disposed on a field region and sidewalls of features formed in the substrate by generating the plasma in the processing region of first process chamber. The controller is further configured to control the third flow control valve so that an amount of etching gas provided to the surface of the substrate preferentially etches the preferentially oxidized portions of the one or more tungsten-containing layers disposed on the field region and sidewalls of features formed in the substrate to be performed in the first process chamber. The controller is further configured to control the first flow control valve and the second flow control valve to deliver an amount of the oxygen-containing gas and the hydrogen-containing gas to the processing region to expose the one or more tungsten-containing layers to the post-etch treatment process comprises exposing the tungsten-containing layers to a hydrogen and oxygen plasma treatment process by generating an inductive coupled plasma comprising the oxygen-containing gas and the hydrogen-containing gas.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
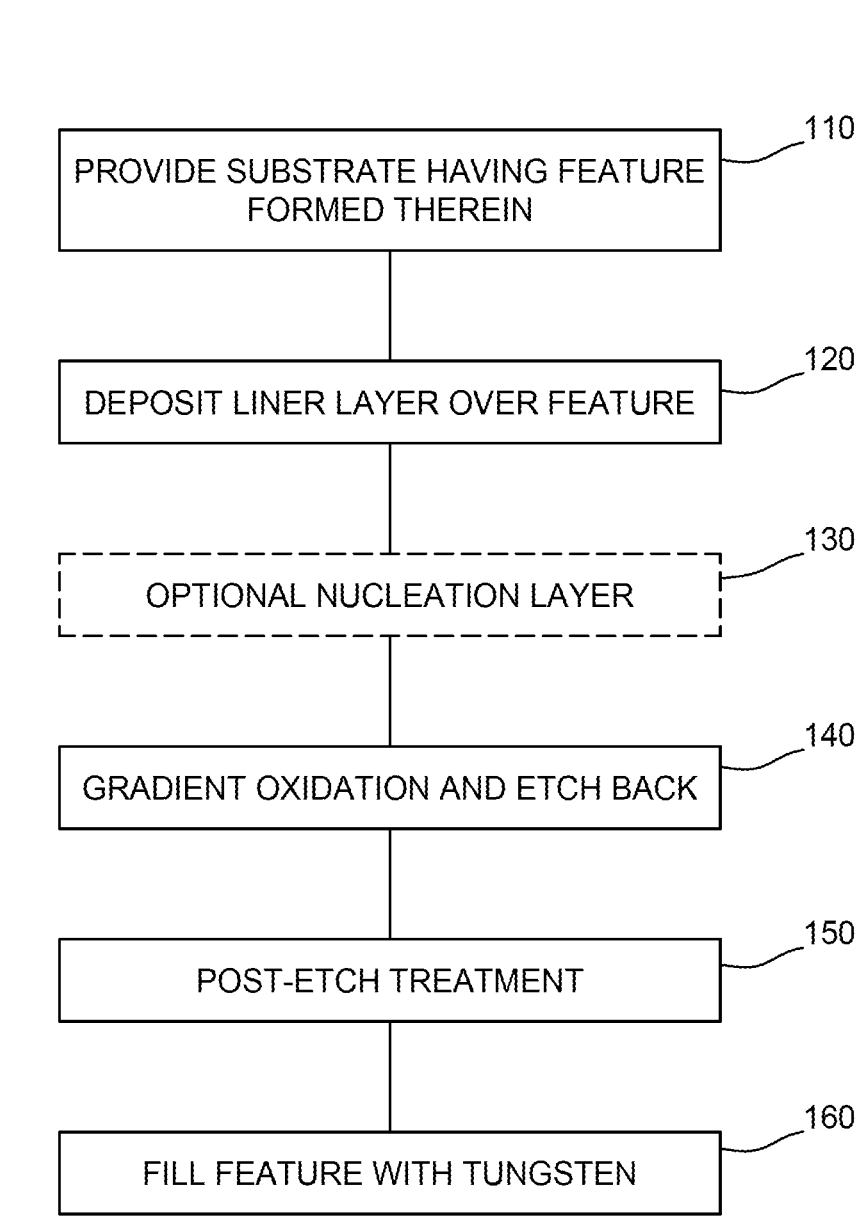
FIG. 1 illustrates a flow chart of a method for manufacturing a semiconductor device in accordance with one or more embodiments of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

In the Summary above and in the Detailed Description, and the claims below, and in the accompanying drawings, reference is made to particular features (including method operations) of the present disclosure. It is to be understood that the disclosure in this specification includes all possible combinations of such particular features. For example, where a particular feature is disclosed in the context of a particular aspect or implementation of the present disclosure, or a particular claim, that feature can also be used, to the extent possible in combination with and/or in the context of other particular aspects and implementations of the present disclosure, and in the present disclosure generally.

The term "comprises" and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

At earlier nodes, larger dimensions made tungsten (W) fill possible using nucleation followed by conformal CVD deposition. However, as the critical dimensions of features continue to shrink, the tops of the ultra-small features are prone to overhang so the conformal process in which the film grows equally on the field region or surface closes or pinches off the opening before filling is complete, leaving voids in the tungsten gap-fill. Even in the absence of voids, center seams are a typical result of conformal deposition as the tungsten gap-fill grows from the sidewall. Tungsten gap-fill is also adversely affected by the presence of impurities. For example, the presence of fluorine-terminated (F-terminated) impurities on the surface of a tungsten liner or seed layer present in the feature. Other impurities such as boron, nitrogen, and tungsten oxide may also adversely affect tungsten gap-fill. One way to achieve good gap-fill is by coating contaminated tungsten surfaces with a nucleation layer (e.g., a boron-tungsten nucleation layer) to hide damage. However, the presence of boron in the nucleation layer may increase the resistivity penalty due to the high boron level in the nucleation layer.

Various embodiments provide improved tungsten gap-fill in features having reduced critical dimensions. In various embodiments, this may be achieved by performing a chemical vapor transport (CVT) process. This CVT process purifies or recovers a tungsten surface to achieve good gap-fill by reducing tungsten-oxide to tungsten while also reducing the presence of impurities such as boron, fluorine, and nitrogen, which may be present on the tungsten surface. In addition, various embodiments may be used to re-open or enlarge feature openings, which have reduced critical dimensions due to the presence of previously deposited layers, for example, barrier layers, liner layers, and/or adhesion layers, overhanging the feature openings.

Various embodiments utilize hydrogen and oxygen plasma treatment to recover the tungsten surface by, for example, reducing the fluorine level, which shows significant increase after etch-back, via chemical vapor transportation. Through this method, the tungsten surface is purified, for example, by reducing or removing contaminants such as boron, nitrogen, and/or fluorine. The hydrogen and oxygen plasma treatment can include a saturation conformal treatment, which includes a longer soak time and/or high reactant treatment, to demonstrate good gap-fill. In various embodiments, the hydrogen and oxygen plasma treatment can be performed at temperatures less than 400 degrees C. In various embodiments, the hydrogen and oxygen plasma treatment includes H2% greater than or equal to 90% of the total flow of hydrogen and oxygen. During the plasma treatment process, the tungsten may be oxidized to form the volatile compound WO2(OH)2, which is immediately reduced back to tungsten. Through this mechanism, the surface of the tungsten is recovered and good gap-fill is achieved without sacrificing resistance. Thus, in some embodiments, not only is good gap-fill achieved but impurities are also reduced because the tungsten surface is recovered by the CVT mechanism.

FIG. 1 illustrates a flowchart of a method 100 for manufacturing a semiconductor device in accordance with one or more embodiments of the present disclosure. The method 100 can be used to fill various features, for example, trenches or vias with a gap-fill metal, for example, tungsten.

At operation 110, a substrate is provided. The substrate may be a device substrate or a semiconductor substrate as described herein. The substrate may include multiple layers. The substrate has one or more features formed therein. The one or more features may include a sidewall surface and a bottom surface. The sidewall surface may be defined by a dielectric material and the bottom surface may be defined by a dielectric material or other materials, for example, a silicide layer, a metal silicide layer, a semiconductor layer, or a metal layer.

At operation 120, a liner layer is formed over the surfaces of the one or more features. The liner layer may be a tungsten layer or tungsten-containing layer. The liner layer may be formed over the sidewall surface and the bottom surface of the one or more features and on the field region of the substrate. The liner layer may be a seed layer and/or an adhesion layer. The liner layer may be a conformal layer. Any suitable liner deposition process may be used to deposit the liner layer. In one example, a physical vapor deposition (PVD) process is used to deposit the liner layer. The liner layer may create an overhang portion in the field region, which obstructs or blocks the top openings of the one or more features.

At operation 130, a nucleation layer may be formed over the liner layer. The nucleation layer may be used to repair any damage or discontinuities in the liner layer. The nucleation layer may be a boron-tungsten nucleation layer or tungsten-containing nucleation layer. Any suitable deposition process may be used to deposit the nucleation layer. In some embodiments, an atomic layer deposition (ALD) process is used to deposit the nucleation layer. In one example, one cycle of the ALD process includes a boron pulse/a boron purge/a tungsten pulse/a tungsten purge. The ALD process may be repeated for any number of cycles sufficient to deposit a nucleation layer of targeted thickness. In one example, the ALD cycle is repeated for 3 to 5 cycles. The nucleation layer may also contribute to the thickness of the overhang portion (if present) formed by the liner layer during operation 120.

At operation 140, the liner layer and nucleation layer (e.g., together tungsten-containing layers or first tungsten layer) are exposed to a gradient oxidation and etchback process. The gradient oxidation process oxidizes portions of the tungsten-containing layers to be removed and the etch-back process selectively removes the oxidized portions. The gradient oxidation and etchback process can reduce the thickness of or eliminate the overhang portion obstructing the openings of the one or more features. The thickness of the tungsten-containing layers formed over the field region may be reduced at a greater rate than a thickness of the tungsten-containing layers formed over the sidewall surfaces and the bottom surfaces of the feature. The gradient oxidation and etchback process can selectively reduce the thickness of the tungsten-containing layers formed over the sidewall surfaces of the feature. The thickness of the tungsten-containing layers formed over the sidewall surfaces may be reduced at a greater rate than a thickness of the tungsten-containing layers formed over the bottom surface. The tungsten-containing layers may be reduced from the initial thickness to a reduced thickness. The gradient oxidation process may selectively oxidize the tungsten-containing layers formed on the sidewall surfaces and the field region of the substrate. The gradient oxidation process may include exposing the one or more tungsten-containing layers to a plasma oxidation process to oxidize portions of the tungsten-containing layers. The etchback process may include exposing the tungsten-containing layers to an etchant process to remove the oxidized portions of tungsten-containing layers. The gradient oxidation process and the etchback process may be a cyclic process. For example, one cycle may include the gradient oxidation process followed by the etchback process. The gradient oxidation and etchback process may be repeated for a number of cycles sufficient to reduce the thickness of the one or more tungsten-containing layers from the initial thickness to a targeted reduced thickness. For example, the gradient oxidation and etchback process may be repeated for two to four cycles, for example, two cycles.

At operation 150, after the gradient oxidation and etchback process of operation 140, the tungsten-containing layers are exposed to a post-etch treatment process. During the post-etch treatment process exposed surfaces of the tungsten-containing layers may be oxidized to form tungsten oxide (e.g., WO2). This tungsten oxide can interfere with the subsequently performed tungsten gap-fill process. The post-etch treatment process reduces tungsten oxide to tungsten. In addition, the post-etch treatment process treatment purifies or recovers the tungsten surface, for example, by reducing or removing contaminants such as fluorine, boron, and/or nitrogen, which may be present on the tungsten surface. The post-etch treatment process may include a chemical vapor transport (CVT) process. The CVT process can recover or purify the surface of the tungsten-containing layers to achieve good gap-fill while maintaining or improving the resistivity of the formed device. In one example the CVT process includes a volatilization process and a reduction process. The volatilization process may proceed via the following reaction (I):

$$WO2+2H2O \rightarrow WO2(OH)2+H2 \qquad (I)$$

The reduction process may proceed via the following reaction:

$$WO2(OH)2+3H2 \rightarrow W+4H2O \qquad (II)$$

In some embodiments, the post-etch treatment process may include exposing the tungsten-containing layers to a plasma treatment process. In some embodiments, the plasma treatment process can include exposing the tungsten-containing layers to a hydrogen and oxygen plasma treatment. The hydrogen and oxygen plasma treatment can include a saturation conformal treatment, which includes a longer soak time and/or high reactant treatment, to demonstrate good gap-fill. In some embodiments, the hydrogen and oxygen plasma treatment is performed at temperatures less than 400 degrees C. In various embodiments, the hydrogen and oxygen plasma treatment includes H2% greater than or equal to 90 of the total flow of hydrogen and oxygen. In some embodiments the hydrogen and oxygen plasma treatment is an inductively coupled plasma process. In alternative embodiments, the hydrogen and oxygen plasma treatment is a capacitively coupled plasma process. In other embodiments, the hydrogen and oxygen plasma is formed in a remote plasma source (RPS). In other embodiments, the plasma is generated within the processing chamber (direct plasma).

In some embodiments, the treated tungsten is oxidized and forms the volatile compound WO2(OH)2, which is immediately reduced back to tungsten. Through this mechanism, the surface of the tungsten is recovered and good gap-fill is achieved without sacrificing resistance. Thus, not only is good gap-fill achieved but impurities are also reduced because the tungsten surface is recovered by the CVT mechanism.

At operation 160, the one or more features are filled with a second tungsten layer. The second tungsten layer may be a tungsten gap-fill layer. Any suitable tungsten deposition process may be used to deposit the tungsten gap-fill layer. The second tungsten layer may be deposited via a chemical vapor deposition (CVD) gap-fill process. The second tungsten layer may partially or completely fill the one or more features. The clean surfaces of the tungsten-containing layers provide for good gap-fill by the second tungsten layer.

With reference to FIGS. 2A-2F, cross-sectional views of some embodiments of a device structure for semiconductor devices at various stages of manufacture are provided to illustrate the method of FIG. 1. Although FIGS. 2A-2F are described in relation to the method 100, it will be appreciated that the structure disclosed in FIGS. 2A-2F are not limited to the method 100 but instead may stand alone as structures independent of method 100. Similarly, although the method 100 is described in relation to FIGS. 2A-2F, it will be appreciated that the method 100 is not limited to the structures disclosed in FIGS. 2A-2F but instead may stand alone independent of the structures disclosed in FIGS. 2A-2F.

FIGS. 2A-2F illustrate views of various stages of manufacturing a semiconductor device in accordance with one or more embodiments of the present disclosure.

Figure 2A:
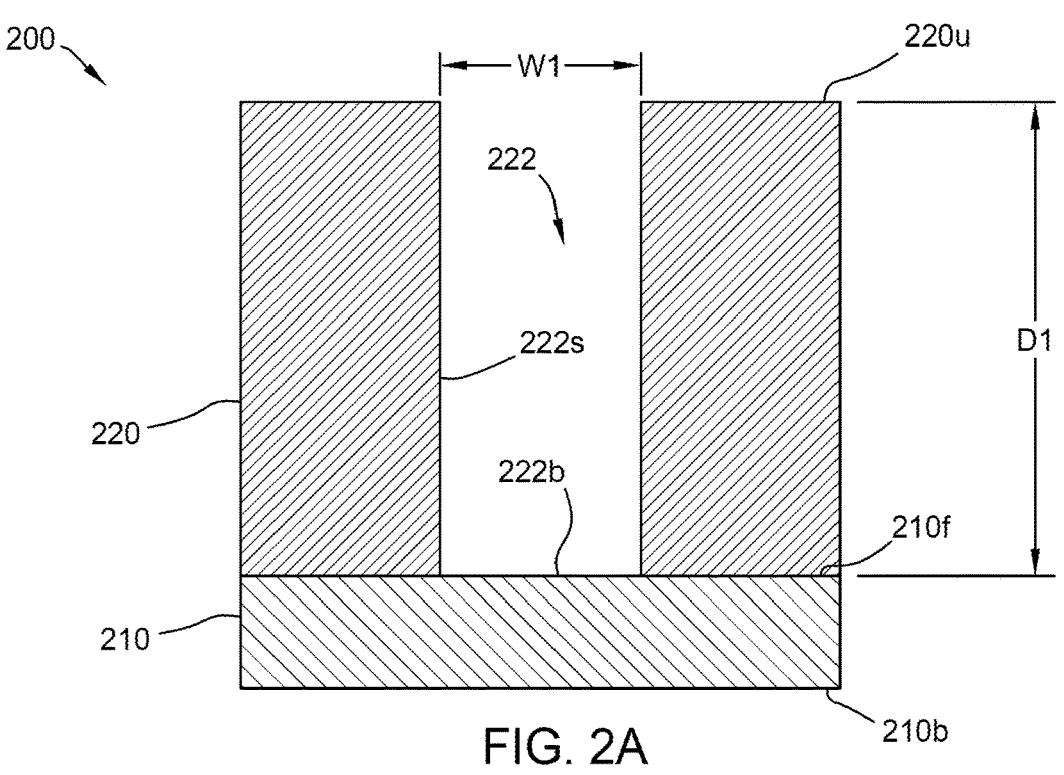
FIGS. 2A-2F illustrate views of various stages of manufacturing a semiconductor device in accordance with one or more embodiments of the present disclosure.

FIG. 2A illustrates a cross-sectional view of a semiconductor device structure 200 during intermediate stages of manufacturing corresponding to operation 110, in accordance with some embodiments. The semiconductor device structure 200 includes a device substrate 210 having a dielectric layer 220 formed thereon. The device substrate 210 may be or include a bulk semiconductor substrate, a semiconductor-on-insulator (SOI) substrate, or the like, which may be doped (e.g., with a p-type dopant or an n-type dopant) or undoped. In some embodiments, the semiconductor material of the device substrate 210 may include an elemental semiconductor, for example, such as silicon (Si) or germanium (Ge); a compound semiconductor including, for example, silicon carbide, gallium arsenide, gallium phosphide, indium phosphide, indium arsenide, and/or indium antimonide; an alloy semiconductor including, for example, SiGe, GaAsP, AlInAs, GaInAs, GaInP, and/or GaInAsP; a combination thereof, or the like. The device substrate 210 may include additional materials, for example, silicide layers, metal silicide layers, metal layers, dielectric layers, or a combination thereof.

The device substrate 210 may further include integrated circuit devices (not shown). As one of ordinary skill in the art will recognize, a wide variety of integrated circuit devices such as transistors, diodes, capacitors, resistors, the like, or combinations thereof may be formed in and/or on the device substrate 210 to generate the structural and functional requirements of the design for the resulting semiconductor device structure 200.

The device substrate 210 has a frontside 210f (also referred to as a front surface) and a backside 210b (also referred to as a back surface) opposite the frontside 210f. The dielectric layer 220 is formed over the frontside 210f of the device substrate 210. The dielectric layer 220 may include multiple layers. The dielectric layer 220 includes an upper surface or field region 220u. In some embodiments, the dielectric layer 220 includes silicon oxide, silicon oxynitride, silicon nitride, or a combination thereof. In some embodiments, the dielectric layer 220 consists essentially of silicon oxide. It is noted that the foregoing descriptors (e.g., silicon oxide) should not be interpreted to disclose any particular stoichiometric ratio. Accordingly, "silicon oxide" and the like will be understood by one skilled in the art as a material consisting essentially of silicon and oxygen without disclosing any specific stoichiometric ratio.

The dielectric layer 220 is patterned to form one or more feature(s) 222. In some embodiments, the feature 222 can be selected from a trench, a via, a hole, or combinations thereof. In particular embodiments the feature 222 is a via. In some embodiments, the feature 222 extends from the field region 220u of the dielectric layer 220 to the frontside 210f of the device substrate 210. The feature 222 includes sidewall surface 222s and a bottom surface 222b extending between the sidewall surface 222s. In some embodiments, the sidewall surface 222s are tapered. The sidewall surface 222s may be defined by the dielectric layer 220 and the bottom surface may be defined by the device substrate 210. In some embodiments, the sidewall surface 222s may be defined by the dielectric layer 220 and the bottom surface may also be defined by the dielectric layer 220. The feature 222 has a first depth "D1" from the field region 220u to the bottom surface 222b and a width "W1" between the two sidewall surfaces 222s. In some embodiments, the depth D1 is in a range of 2 nm to 200 nm, 3 nm to 200 nm, 5 nm to 100 nm, 2 nm to 100 nm, or 50 nm to 100 nm. In some embodiments, the width W1 is in a range of 10 nm to 100 nm, 10 nm to 20 nm, 10 nm to 50 nm, or 50 nm to 100 nm. In some embodiments, the feature 222 has an aspect ratio (D/W) in a range of 1 to 20, 5 to 20, 10 to 20, or 15 to 20.

Figure 2B:
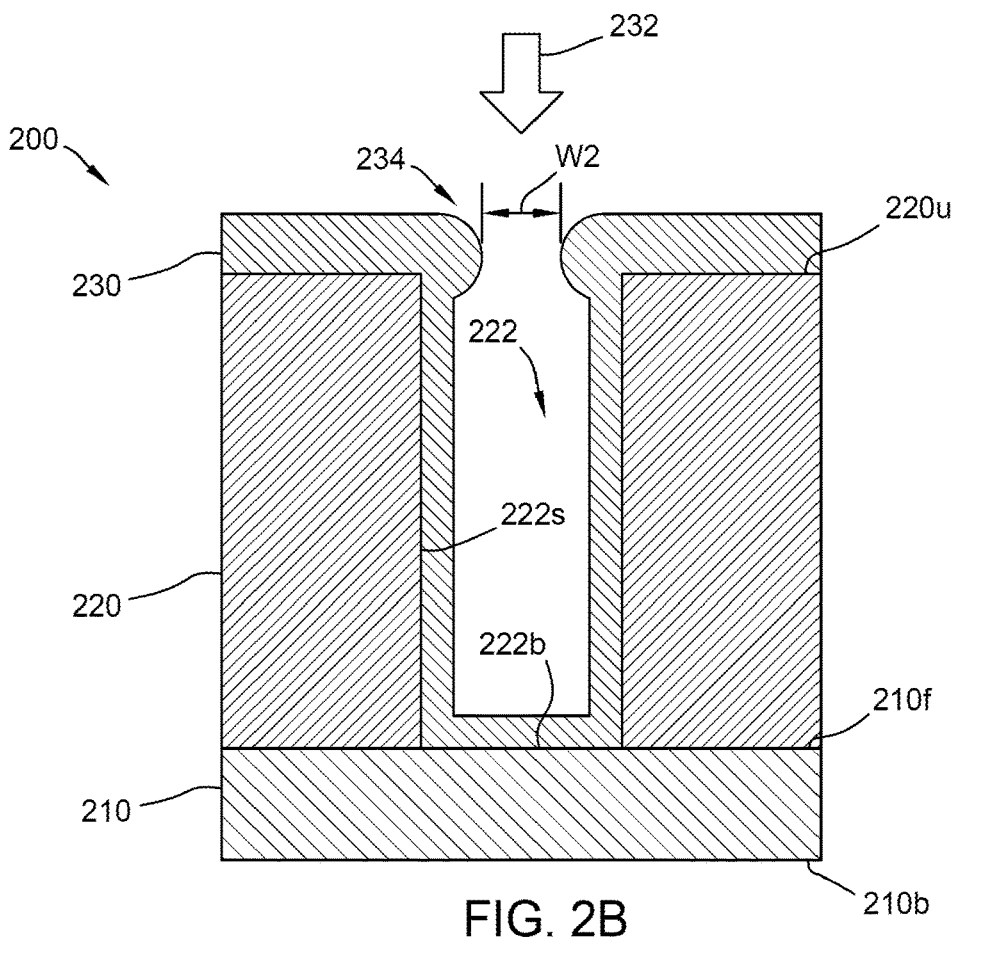

FIG. 2B illustrates a cross-sectional view of the semiconductor device structure 200 during intermediate stages of manufacturing corresponding to operation 120, in accordance with some embodiments. At operation 120 a liner layer, for example, a liner layer 230 is formed over the surfaces of the feature 222. The liner layer 230 may function as a barrier and/or adhesion layer. The liner layer 230 may be a tungsten liner layer. The liner layer 230 may be formed by an ALD process or a PVD process 232. The liner layer 230 may be formed over the sidewall surface 222s and the bottom surface 222b of the feature 222 and on the field region 220u of the dielectric layer 220. The liner layer 230 may be a conformal layer. The liner layer 230 may have an initial thickness in a range from about 1 Å to about 100 Å, for example, in a range from about 20 Å to about 50 Å. In some embodiments, the liner layer 230 may be discontinuous along for example, the sidewall surface 222s and/or the bottom surface 222b. Any suitable tungsten deposition process may be used to deposit the liner layer 230. In one example, a PVD process is used to deposit the liner layer 230. The liner layer 230 may create an overhang portion 234 in the field region 220u, which obstructs or blocks the top openings of the feature 222. As depicted in FIG. 2B, the overhang portion 234 reduces the width of the top opening from W1 to W2.

Figures 2C, 2D:
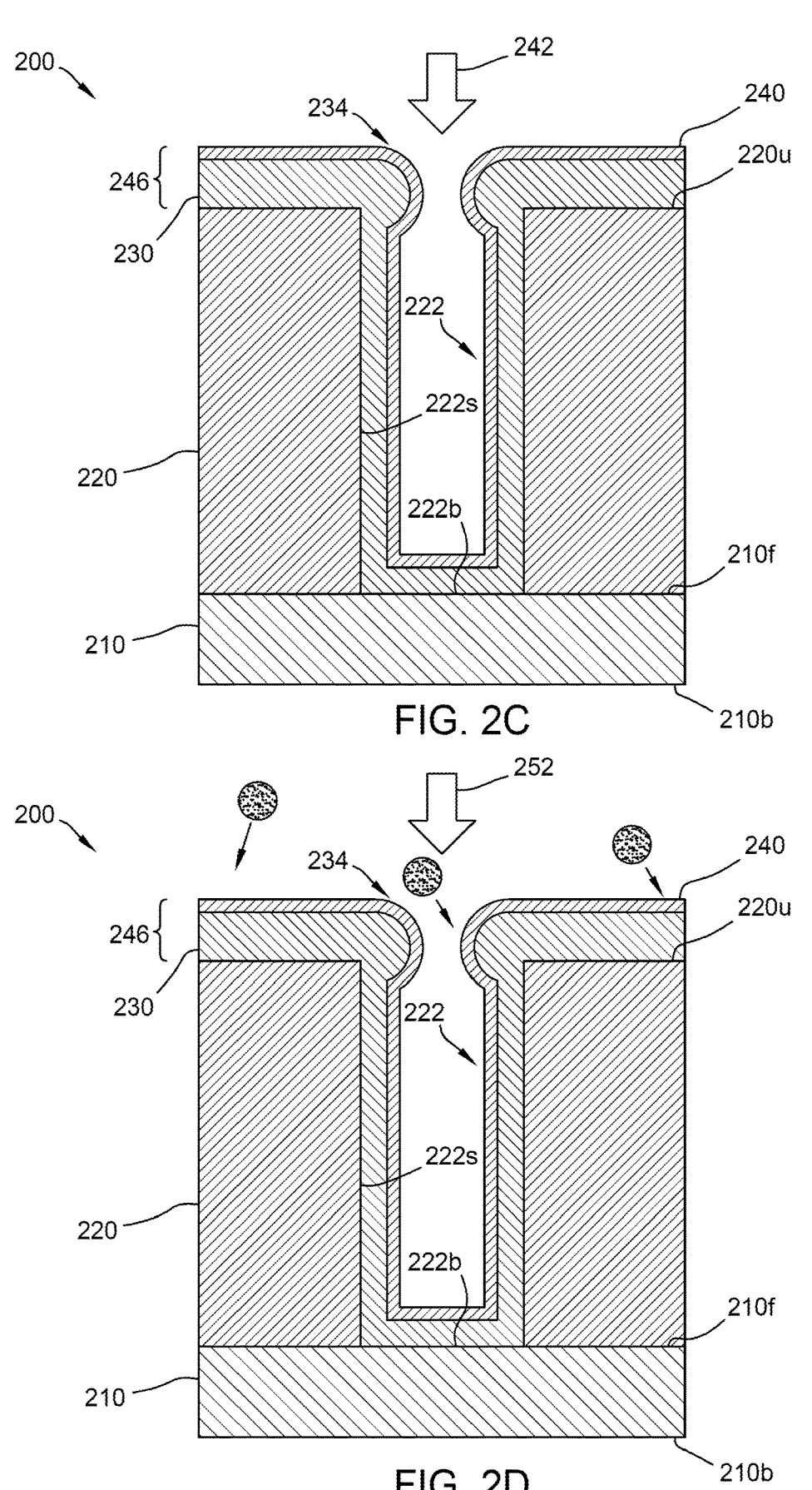

FIG. 2C illustrates a cross-sectional view of the semiconductor device structure 200 during intermediate stages of manufacturing corresponding to operation 130, in accordance with some embodiments. At operation 130, a nucleation layer, for example, a nucleation layer 240 is formed over the surfaces of the feature 222, for example, over the surfaces of the liner layer 230. The nucleation layer 240 may function as a seed layer for subsequent deposition of the tungsten gap-fill material. In addition, in some embodiments where the previously deposited liner layer 230 is discontinuous, for example, along the sidewall surface 222s, the nucleation layer 240 may repair discontinuous portions of the liner layer 230. The nucleation layer 240 may be a tungsten-containing layer, for example, a boron-tungsten nucleation layer. The nucleation layer 240 may be a conformal layer. Any suitable nucleation layer deposition process 242 may be used to deposit the nucleation layer 240. In some embodiments, an ALD process is used to deposit the nucleation layer 240. In other embodiments, a PVD process may be used. In alternate embodiments, a low temperature and low pressure CVD process may be used. As depicted in FIG. 2C, the liner layer 230 and nucleation layer 240 may be referred to individually or together as the tungsten-containing layers 246.

In some embodiments, forming the nucleation layer 240 includes the semiconductor device structure 200 to a tungsten-containing precursor gas at a first precursor gas flow rate. In some embodiments, forming the nucleation layer 240 includes exposing the semiconductor device structure 200 to a reducing agent. In some embodiments, the reducing agent includes boron and is introduced to the processing region at a reducing agent flow rate. In some embodiments, the tungsten-containing precursor gas and the reducing agent are alternated cyclically to form the nucleation layer 240 over the semiconductor device structure 200 within the feature 222 at the reducing agent flow rate. In some embodiments, the reducing agent and the tungsten-containing precursor gas are cyclically alternated, beginning with either the reducing agent or the tungsten-containing precursor gas, and ending with the same beginning gas or ending with a gas different from the beginning gas. In some embodiments, the reducing agent or the tungsten-containing precursor gas are cyclically alternated beginning with the tungsten-containing precursor gas and ending in the reducing agent.

In some embodiments, the nucleation layer 240 is deposited using the ALD process. The ALD process includes repeating cycles of alternately exposing feature 222 to a tungsten-containing precursor and exposing the feature 222 to a reducing agent. In some embodiments, the processing region is purged between the alternating exposures. In some embodiments, the process region is continuously purged. Examples of suitable tungsten-containing precursors include tungsten halides, such as tungsten hexafluoride ($WF_6$), tungsten hexachloride ($WCl_6$), or a combination thereof. In some embodiments, the tungsten-containing precursor includes $WF_6$, and the reducing agent includes a boron-containing agent, such as $B_2H_6$. In some embodiments, the tungsten-containing precursor includes an organometallic precursor and/or a fluorine-free precursor, for example, MDNOW (methylcyclopentadienyl-dicarbonylnitrosyl-tungsten), EDNOW (ethylcyclopentadienyl-dicarbonylnitrosyl-tungsten), tungsten hexacarbonyl ($W(CO)_6$), or a combination thereof.

In some embodiments, during the nucleation layer deposition process 242, the processing region is maintained at a pressure of less than about 120 Torr, such as in a range from about 900 mTorr to about 120 Torr, in a range from about 1 Torr to about 100 Torr, or for example, in a range from about 1 Torr and about 50 Torr. Exposing the substrate 400 to the tungsten-containing precursor includes flowing the tungsten-containing precursor into the processing region from at a flow rate of about 100 sccm or less, such as in a range from about 10 sccm to about 60 sccm, or in a range from about sccm to about 80 sccm. Exposing the semiconductor device structure 200 to the reducing agent includes flowing the reducing agent into the processing region at a flow rate of about 200 sccm to about 1000 sccm, such as between about 300 sccm and about 750 sccm. It should be noted that the flow rates for the various deposition and treatment processes described herein are for a processing system configured to process a 300 mm diameter substrate. Appropriate scaling may be used for processing systems configured to process different-sized substrates.

In some embodiments, the tungsten-containing precursor and the reducing agent are each flowed into the processing region for a duration in a range from about 0.1 seconds to about 10 seconds, such as in a range from about 0.5 seconds to about 5 seconds. The processing region may be purged between the alternating exposures by flowing a purge gas, such as argon (Ar) or hydrogen gas, into the processing region for a duration in a range from about 0.1 seconds to about 10 seconds, such as in a range from about 0.5 seconds to about 5 seconds. Typically, the repeating cycles of the nucleation process continue until the nucleation layer 240 has a thickness in a range from about 10 Å to about 200 Å, such as in a range from about 10 Å to about 150 Å, or in a range from about 20 Å to about 150 Å. In one example, the ALD cycle is repeated for 3 to 5 cycles. The nucleation layer 240 is disposed along sidewall surface 222s and/or the bottom surfaces 222b of the feature 222, such as over the liner layer 230. The nucleation layer 240 may also contribute to the thickness of the overhang portion 234 formed by the liner layer during operation 120.

FIG. 2D illustrates a cross-sectional view of the semiconductor device structure 200 during intermediate stages of manufacturing corresponding to operation 140, in accordance with some embodiments. At operation 140, the semiconductor device structure 200 is exposed to a gradient oxidation and etchback process 252. The gradient oxidation process oxidizes exposed portions of the liner layer 230 and the nucleation layer 240 (if present) to be removed and the etchback process selectively removes the oxidized portions. The gradient oxidation process can preferentially oxidize the overhang portion 234, which obstructs or blocks the openings of the feature 222. The gradient oxidation and etchback process 252 can reduce the thickness of or eliminate the overhang portion 234 obstructing the openings of the feature 222. The thickness of the layers formed over the field region 220u may be reduced at a greater rate than a thickness of the layers formed over the sidewall surface 222s and/or the bottom surfaces 222b. The gradient oxidation and etchback process 252 can selectively reduce the thickness of the layers formed over the sidewall surface 222s of the substrate. The thickness of the layers formed over the sidewall surface 222s may be reduced at a greater rate than a thickness of the layers formed over the bottom surface 222b. The tungsten-containing layers 246 may be reduced from an initial thickness to a reduced thickness. The gradient oxidation process may selectively oxidize the layers formed on the sidewall surface 222s and the field region 220u of the dielectric layer 220. The gradient oxidation process may include exposing the tungsten-containing layers 246 to a plasma oxidation process to selectively oxidize portions of the layers. In some embodiments, the gradient oxidation process further includes a plasma reduction process performed prior to the plasma oxidation process. The etchback process may include exposing the layers to an etchant process to selectively remove the oxidized portions of the tungsten-containing layers 246. The gradient oxidation process and the etchback process may be a cyclic process. For example, one cycle may include the gradient oxidation process followed by the etchback process. The gradient oxidation and etchback process may be repeated for a number of cycles sufficient to reduce the thickness of the layers from the initial thickness to a targeted reduced thickness. For example, the gradient oxidation and etchback process may be repeated for two to four cycles, for example, two cycles.

In some embodiments, the gradient oxidation process includes the use of an O2 inductively coupled plasma (ICP) that includes a limited gas flow to create an O starvation reaction mode on the exposed metal layer (e.g., tungsten layer). The O2 ICP provides a low power O2 plasma with a high ion/radical ratio, which enhances the field oxidation and kills the reactive species before reaching the tungsten-containing layers 246 over the bottom surface 222b. In this mode the field region 220u is oxidized or more heavily oxidized, which allows for preferential etching of the oxidized regions so that a layer of tungsten is left along the sidewall surface 222s and along the bottom surface 222b of the feature 222. Therefore, in the subsequent tungsten gap-fill process performed at operation 160, a good quality bottom seed and sidewall seed is formed by performing a gradient oxidation and oxidized metal removal sequence so that a gap-fill process can then be performed on the bottom seed layer and the sidewall seed layer. The remaining layers on the sidewall surface 222s and the bottom surface 222b also function as a protection layer for any under-layer structure, which is present during the process.

In some embodiments, the gradient oxidation process and the etchback (e.g., oxide removal process) can be performed in two process chambers. In other embodiments, the gradient oxidation and etchback process 252 can be performed in the same chamber, for example, an ICP reactor, which enables multi-cycling capability with high wafer throughput benefits. In addition, the gradient oxidation and etchback process 252 may overcome the challenges of seams and voids during the subsequent metal gap-fill by removing field metal while maintaining seeding metal along the sidewall surface 222s and along the bottom surface 222b of the feature 222. Thus, seam-free tungsten gap-fill can be achieved.

In some embodiments, the gradient oxidation process includes a reduction process followed by an oxidation process. In some embodiments, the gradient oxidation process includes the oxidation process without the reduction process. The reduction process includes exposing the substrate to a reducing gas, for example, hydrogen. The oxidation process includes exposing the substrate to an oxidizing gas, for example, oxygen. In some embodiments, during the reduction process, the processing region is maintained at a pressure of less than about 120 mTorr, such as in a range from about 50 mTorr to about 110 mTorr, in a range from about 60 mTorr to about 100 Torr, or for example, in a range from about 70 mTorr to about 90 mTorr. Exposing the semiconductor device structure 200 to the reducing gas includes flowing the reducing gas into the processing region at a flow rate of about 200 sccm or less, such as in a range from about 100 sccm to about 170 sccm, or in a range from about 120 sccm to about 80 sccm. Exposing the semiconductor device structure 200 to the reducing agent may further include flowing a carrier gas, for example, an inert gas such as argon into the processing region at a flow rate of about 300 sccm or less, such as in a range from about 100 sccm to about 200 sccm, or in a range from about 120 sccm to about 150 sccm. During the reduction process, the semiconductor device structure 200 may be maintained a temperature of about 450 degrees Celsius or less, such as in a range from about 200 degrees Celsius to about 450 degrees Celsius, in a range from about 250 degrees Celsius to about 400 degrees Celsius, or for example, in a range from about 300 degrees Celsius to about 350 degrees Celsius. During the reduction process, ICP plasma power of 2000 Watts or less, such as in a range from about 500 Watts to 1500 Watts, or for example, in a range from about 850 Watts to about 1000 Watts may be used. The reduction process may be performed for a time period of 60 seconds or less, such as in a range from about seconds to about 40 seconds, or for example, in a range from about 10 seconds to about 30 seconds.

In some embodiments, during the oxidation process, the processing region is maintained at a pressure of less than about 10 mTorr, such as in a range from about 1 mTorr to about 5 mTorr, or for example, in a range from about 1 mTorr to about 2 mTorr. Exposing the semiconductor device structure 200 to the oxidizing gas includes flowing the oxidizing gas into the processing region at a flow rate of about 20 sccm or less, such as in a range from about 1 sccm to about 10 sccm, or in a range from about 1 sccm to about 5 sccm. Exposing the semiconductor device structure 200 to the reducing agent may further include flowing a carrier gas, for example, an inert gas such as argon into the processing region at a flow rate of about 100 sccm or less, such as in a range from about sccm to about 100 sccm, or in a range from about 50 sccm to about 100 sccm. During the oxidation process, the semiconductor device structure 200 may be maintained a temperature of about 450 degrees Celsius or less, such as in a range from about 200 degrees Celsius to about 450 degrees Celsius, in a range from about 250 degrees Celsius to about 400 degrees Celsius, or for example, in a range from about 300 degrees Celsius to about 350 degrees Celsius. During the oxidation process, ICP plasma power of 300 Watts or less, such as in a range from about 100 Watts to 300 Watts, or for example, in a range from about 180 Watts to about 210 Watts. The oxidation process may be performed for a time period of 60 seconds or less, such as in a range from about 10 seconds to about 40 seconds, or for example, in a range from about 12 seconds to about seconds.

In some embodiments, the reduction process is performed at a pressure in a range from about 70 mTorr to about 90 mTorr, at an ICP power in a range from about 900 Watts to about 1200 Watts, at a flow rate of argon gas into the processing region in a range from about 250 sccm to about 300 sccm, at a flow rate of hydrogen gas into the processing region in a range from about 200 sccm to about 250 sccm, at a temperature in a range from about 300 degrees Celsius to about 400 degrees Celsius, and for a time period from about 15 seconds to about 30 seconds.

In some embodiments, the oxidation process is performed at a pressure in a range from about 2 mTorr to about 7 mTorr, at an ICP power in a range from about 210 Watts to about 350 Watts, at a flow rate of argon gas into the processing region in a range from about 900 sccm to about 1000 sccm, at a flow rate of oxygen gas into the processing region in a range from about 5 sccm to about 10 sccm, at a temperature in a range from about 300 degrees Celsius to about 400 degrees Celsius, and for a time period from about seconds to about 180 seconds.

In some embodiments, the etchback process includes flowing an etching gas and optional inert gas into the processing region. The etching gas can include Cl2, WF6, WOCl4, WCl5, WCl6, or a combination thereof. In particular embodiments, the etching gas is WF6. In some embodiments, the etchback process is performed at a pressure in a range from about 5 mTorr to about 20 mTorr, at an ICP power in a range from about 300 Watts to about 400 Watts, at a flow rate of argon gas into the processing region in a range from about 450 sccm to about 500 sccm, at a flow rate of WF6 gas into the processing region in a range from about 5 sccm to about 10 sccm, at a temperature in a range from about 300 degrees Celsius to about 400 degrees Celsius, and for a time period from about 15 seconds to about 30 seconds.

Figure 2E:
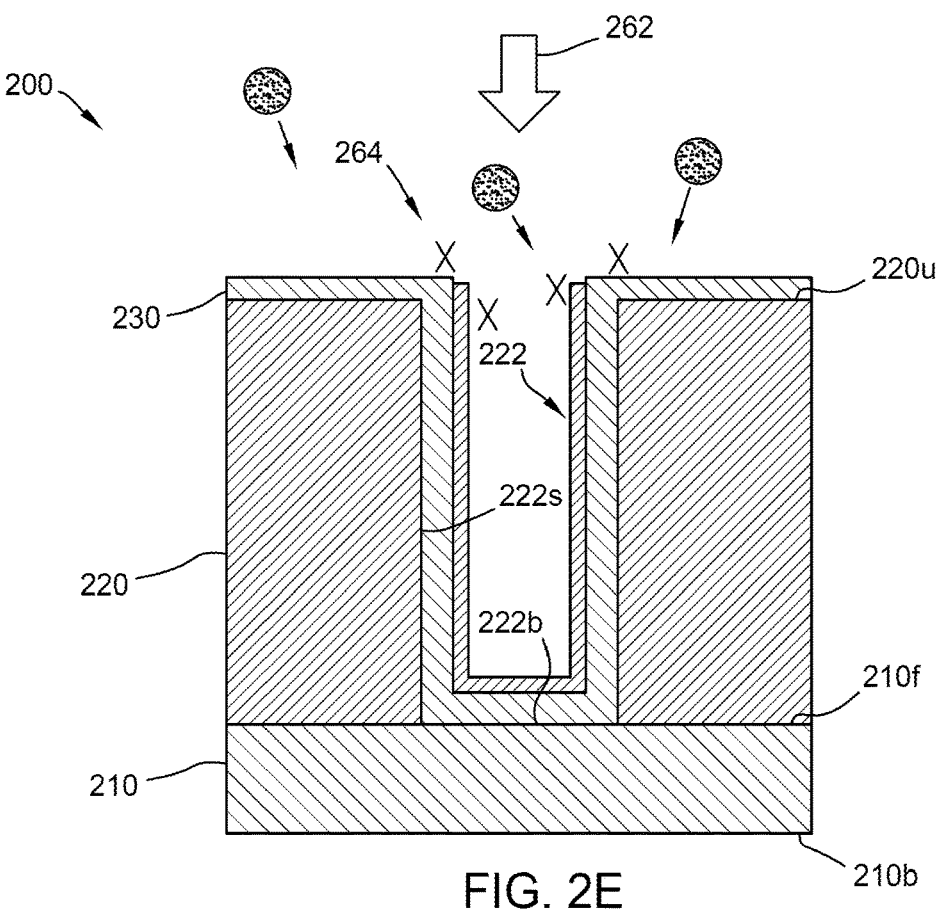

The gradient oxidation process and the etchback process of operation 140 may be repeated until the tungsten-containing layers 246, for example, the liner layer 230 and the nucleation layer 240 are reduced in thickness as shown in FIG. 2E or completely removed from the field region 220u of the dielectric layer 220.

FIG. 2E illustrates a cross-sectional view of the semiconductor device structure 200 during intermediate stages of manufacturing corresponding to operation 150, in accordance with some embodiments. At operation 150, the semiconductor device structure 200 is exposed to a post-etch treatment process 262.

During the post-etch treatment process 262, exposed surfaces of the tungsten-containing layer 246 may be oxidized to form metal oxides, for example, tungsten oxide (e.g., WO2). This tungsten oxide can interfere with the subsequently performed tungsten gap-fill process at operation 160. The post-etch treatment process 262 may reduce this tungsten oxide to tungsten. In addition, the post-etch treatment process 262 may purify or recover the tungsten surface, for example, by reducing the fluorine, boron, and/or nitrogen contaminants 264 which may be present on the surface of the tungsten-containing layers 246. The post-etch treatment process 262 may include a chemical vapor transport (CVT) process. The CVT process can recover or purify the surfaces of the tungsten-containing layers 246 to achieve good gap-fill while maintaining or improving the resistivity of the formed device. In some embodiments, the CVT process includes a volatilization process and a reduction process. The volatilization process may proceed via the following reaction (I):

$$WO2 + 2H2O \rightarrow WO2(OH)2 + H2 \quad (I)$$

The reduction process may proceed via the following reaction:

$$WO2(OH)2 + 3H2 \rightarrow W + 4H2O \quad (II)$$

In some embodiments, the post-etch treatment process 262 may include exposing the tungsten-containing layers 246 to a plasma treatment process. In some embodiments the plasma treatment process is an inductively coupled plasma process. In some embodiments, the plasma treatment process is a capacitively coupled plasma process. In some embodiments, the plasma treatment process is formed in a remote plasma source (RPS). In some embodiments, the plasma treatment process is generated within the processing region (e.g., a direct plasma). In some embodiments, the plasma treatment process can include exposing the tungsten-containing layers 246 to an ICP including a hydrogen-containing gas and an oxygen-containing gas. In some embodiments, the plasma treatment process can include exposing the tungsten-containing layers 246 to a plasma including one or more of H2, O2, Ar, or a combination thereof. In some embodiments, the plasma treatment process can include exposing the tungsten-containing layers to a hydrogen and oxygen plasma treatment. The hydrogen and oxygen plasma treatment can include a saturation conformal treatment, which includes a longer soak time and/or high reactant treatment, to provide for good gap-fill in operation 160.

In some embodiments, the plasma treatment process is performed at temperatures of 400 degrees Celsius or less. In some embodiments, the plasma treatment process includes supplying a processing gas including H2% greater than or equal to 90% of the total flow of hydrogen and oxygen.

In some embodiments, during the post-etch treatment process 262 the processing region is maintained at a pressure of less than about 120 mTorr, such as in a range from about 50 mTorr to about 110 mTorr, in a range from about 60 mTorr to about 100 Torr, or for example, in a range from about 70 mTorr to about 90 mTorr. In some embodiments, the post-etch treatment process 262 includes flowing hydrogen gas into the processing region at a flow rate of about 300 sccm or less, such as in a range from about 100 sccm to about 250 sccm, or in a range from about 150 sccm to about 200 sccm. In some embodiments, the post-etch treatment process 262 further includes flowing oxygen gas into the processing region at a flow rate of about 30 sccm or less, such as in a range from about 10 sccm to about 25 sccm, or in a range from about 15 sccm to about 20 sccm. During the post-etch treatment process 262, a temperature of the semiconductor device structure 200 may be maintained in a range of about 400 degrees Celsius or less, such as in a range from about 200 degrees Celsius to about 400 degrees Celsius, or in a range from about 250 degrees Celsius to about 400 degrees Celsius, or for example, in a range from about 300 degrees Celsius to about 350 degrees Celsius. During the post-etch treatment process 262, ICP plasma power of 2000 Watts or less, such as in a range from about 500 Watts to 1500 Watts, or for example, in a range from about 850 Watts to about 1000 Watts. The post-etch treatment process 262 may be performed for a time period of 60 seconds or less, such as in a range from about 10 seconds to about 40 seconds, or for example, in a range from about 15 seconds to about 30 seconds.

During the post-etch treatment process 262, tungsten is oxidized and forms the volatile compound $WO_2(OH)_2$, which is immediately reduced back to tungsten. In addition, surface contaminants such as fluorine, nitrogen, and/or boron may be removed. Through these mechanisms, the surface of the tungsten is recovered and good gap-fill is achieved without sacrificing resistance. Thus, not only is good gap-fill achieved but impurities are also reduced because the tungsten surface is recovered by the CVT mechanism.

In other embodiments, the post-etch treatment process 262 includes a thermal treatment process. The thermal treatment process may include exposing the semiconductor device structure 200 to gases including H2 and H2O.

In some embodiments, the post-etch treatment process of operation 150 is performed in the same processing chamber as the gradient oxidation and etchback of operation 140 without breaking vacuum.

Figure 2F:
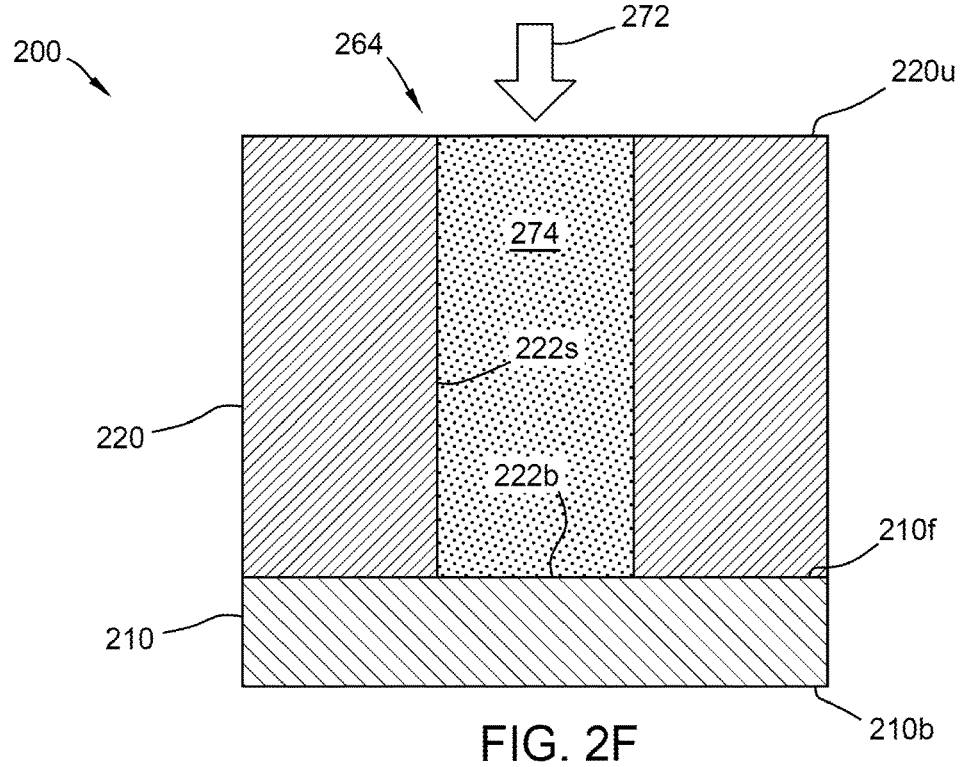

FIG. 2F illustrates a cross-sectional view of the semiconductor device structure 200 during intermediate stages of manufacturing corresponding to operation 160, in accordance with some embodiments. At operation 160, a tungsten gap-fill material 274 is optionally deposited via a tungsten gap-fill process 272, at least partially, into the feature 222.

In some embodiments, the tungsten gap-fill material 274 is formed using a chemical vapor deposition (CVD) process comprising concurrently flowing (co-flowing) a tungsten-containing precursor gas, and a reducing agent into the processing region and exposing the semiconductor device structure 200 thereto. The tungsten-containing precursor and the reducing agent used for the tungsten gap-fill CVD process may include any combination of the tungsten-containing precursors and reducing agents described herein. In some embodiments, the tungsten-containing precursor includes $WF_6$, and the reducing agent includes hydrogen gas. In some embodiments, the tungsten gap-fill material 274 partially fills the features 222.

In some embodiments, the tungsten-containing precursor is flowed into the processing region at a flow rate in a range from about 10 sccm to about 1200 sccm, or more than about 50 sccm, or less than about 1000 sccm, or in a range from about 100 sccm to about 900 sccm. The reducing agent is flowed into the processing region at a rate of more than about 500 sccm, such as more than about 750 sccm, more than about 1000 sccm, or in a range from about 500 sccm and about 10000 sccm, such as in a range from about 1000 sccm to about 9000 sccm, or in a range from about 1000 sccm and about 8000 sccm.

In some embodiments, the tungsten gap-fill CVD process conditions are selected to provide a tungsten feature having a relatively low residual film stress when compared to conventional tungsten CVD processes. For example, in some embodiments, the tungsten gap-fill CVD process includes heating the substrate to a temperature of about 250° C. or more, such as about 300° C. or more, or in a range from about 250° C. to about 500° C., or in a range from about 300° C. to about 500° C. During the CVD process, the processing region may be maintained at a pressure of less than about 500 Torr, less than about 600 Torr, less than about 500 Torr, less than about 400 Torr, or in a range from about 1 Torr to about 500 Torr, such as in a range from about 1 Torr to about 450 Torr, or in a range from about 1 Torr to about 400 Torr, or for example, in a range from about 1 Torr and about 300 Torr.

In another embodiment, the tungsten gap-fill material 274 is deposited at operation 160 using an atomic layer deposition (ALD) process. The tungsten gap-fill ALD process includes repeating cycles of alternately exposing the semiconductor device structure 200 to a tungsten-containing precursor gas and a reducing agent and purging the processing region between the alternating exposures.

The tungsten-containing precursor and the reducing agent are each flowed into the processing region for a duration of between about 0.1 seconds and about 10 seconds, such as between about 0.5 seconds and about 5 seconds. The processing region may be purged between the alternating exposures by flowing an inert purge gas, such as argon (Ar) or hydrogen, into the processing region for a duration in a range from about 0.1 seconds to about 10 seconds, such as in a range from about 0.5 seconds to about 5 seconds.

In other embodiments, the tungsten gap-fill material 274 is deposited using a pulsed CVD method that includes repeating cycles of alternately exposing the semiconductor device structure 200 to a tungsten-containing precursor gas and a reducing gas without purging the processing region. The processing conditions for the tungsten gap-fill pulsed CVD method may be the same, substantially the same, or within the same ranges as those described above for the tungsten gap-fill ALD process.

In some embodiments, as is shown in FIG. 2F, the liner layer 230, the nucleation layer 240 and the tungsten gap-fill material 274 are monolithic and do not have an interface therebetween. The tungsten gap-fill material 274, the liner layer 230, and the nucleation layer 240 together form a tungsten-containing layer.

In a typical semiconductor manufacturing scheme, a chemical mechanical polishing (CMP) process may be used to remove an overburden of tungsten material (and the barrier layer disposed there below) from the field region 220*u* of the semiconductor device structure 200 following depositing the tungsten gap-fill material 274 into the feature 222.

Figure 3:
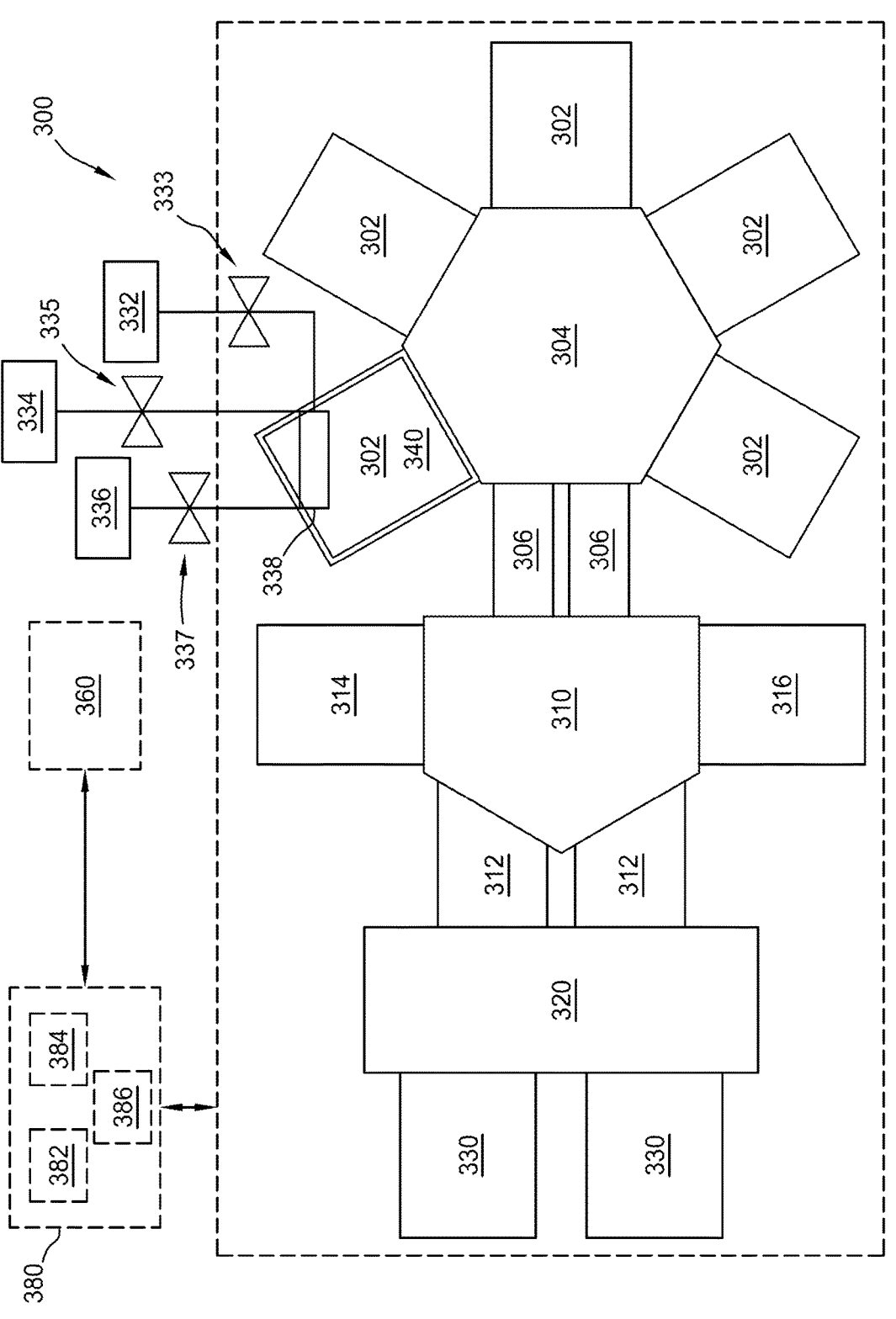
FIG. 3 illustrates a schematic top view of one example of a multi-chamber processing tool in accordance with one or more embodiments of the present disclosure.

Examples of a processing system that may be suitably modified in accordance with the teachings provided herein include an integrated processing system or other suitable processing systems commercially available from Applied Materials, Inc., located in Santa Clara, California. It is contemplated that other processing systems (including those from other manufacturers) may be adapted to benefit from aspects described herein. FIG. 3 illustrates a schematic top-view diagram of an example multi-chamber processing system 300 or cluster tool that can be used to complete a gradient oxidation and etch of a PVD metal followed by a post-etch treatment process according to implementations of the present disclosure. As shown in FIG. 3, a plurality of process chambers 302 is coupled to a first transfer chamber 304. The first transfer chamber 304 is also coupled to a first pair of pass-through chambers 306. The first transfer chamber 304 has a centrally disposed transfer robot (not shown) for transferring substrates between the pass-through chambers 306 and the process chambers 302. The pass-through chambers 306 are coupled to a second transfer chamber 310, which is coupled to a process chamber 314 that is configured to perform pre-clean process and a process chamber 316 that is configured to perform an epitaxial or alternatively, a PVD deposition process. The second transfer chamber 310 has a centrally disposed transfer robot (not shown) for transferring substrates between a set of load lock chamber 312 and the process chamber 314 or the process chamber 316. A factory interface 320 is connected to the second transfer chamber 310 by the load lock chambers 312. The factory interface 320 is coupled to one or more pods 330 on the opposite side of the load lock chambers 312. The pods 330 typically are front opening unified pods (FOUP) that are accessible from a clean room.

Prior to various operations, a substrate may first be transferred to the process chamber 314 where a pre-clean process is performed to remove contaminant, such as carbon or oxide contaminant from exposed surface of a source/drain region of a transistor of the substrate.

The substrate is then transferred to one or more of the process chambers 302. In some implementations, the process chamber 302 may etch a via or a trench in the substrate. In some implementations, the substrate is provided to an etch chamber, which is not a part of the processing system that contains the process chambers 314, 316 and the one or more process chambers 302, to perform the trench formation process. In other operations, the substrate is provided with trenches formed therein. Once the trench is formed in the dielectric material, the substrate is transferred to the process chamber 314 for cleaning.

Then the substrate is transferred to the process chamber 316 and/or at least one of the process chambers 302 where operations are performed. For example, the substrate is transferred to at least one of the process chambers 302 where a metal deposition operation is performed to form a seed layer. The metal can be deposited in any suitable chamber such as a PVD, atomic layer deposition (ALD), epitaxial (EPI) or other suitable chamber.

The substrate may be transferred to one of the process chambers 302 where a gradient oxidation operation may be performed. The gradient oxidation may be performed in an inductively coupled plasma (ICP) reactor or other suitable plasma processing chamber. The gradient oxidation operation is configured to oxidize unwanted portions of the metal layer formed on the substrate.

The substrate may be transferred to one of the process chambers 302 where an etch operation is performed to selectively remove the oxidized portions of the deposited metal layer. For example, the etch operation may be performed in an etch chamber. Alternately, the etch operation may be performed in the ICP reactor in which the gradient oxidation was performed.

After the etch operation, the substrate may be transferred to one of the process chambers 302 where a post-etch treatment process is performed to reduce tungsten oxide to tungsten and optionally remove contaminants from the tungsten surface. For example, the post-etch treatment process may be performed in the ICP reactor in which the gradient oxidation and etchback were performed. The post-etch treatment process may be a CVT process, for example, a hydrogen and oxygen treatment process as described herein.

After the post-etch treatment process a portion of the deposited metal layer (e.g., seed material) will remain along the sidewall surfaces and the bottom surfaces of the feature or trench. The substrate can then be transferred to one of the process chambers 302 or 316 where a gap-fill operation is performed. The gap-fill operation may be performed in a CVD, ALD or other suitable chamber. For example, process chambers 302 or 316 may deposit a metal such as tungsten or other suitable material for growth from the seed layer at the bottom of the trench or feature for forming a portion of a microelectronic device.

A system controller 380 is coupled to the processing system 300 for controlling the processing system 300 or components thereof. For example, the system controller 380 may control the operations of the processing system 300 using a direct control of the process chambers 302, 304, 306, 310, 312, 314, 316, 320, 330 of the processing system 300 or by controlling controllers associated with the process chambers 302, 304, 306, 310, 312, 314, 316, 320, 330, 360. In operation, the system controller 380 enables data collection and feedback from the respective chambers to coordinate performance of the processing system 300.

The system controller 380 generally includes a central processing unit (CPU) 382, memory 384, and support circuits 386. The CPU 382 may be one of any form of a general purpose processor that can be used in an industrial setting. The memory 384, non-transitory computer-readable medium, or machine-readable storage device, is accessible by the CPU 382 and may be one or more of memory such as random access memory (RAM), read only memory (ROM), floppy disk, hard disk, or any other form of digital storage, local or remote. The support circuits 386 are coupled to the CPU 382 and may comprise cache, clock circuits, input/output subsystems, power supplies, and the like. The various implementations disclosed in this disclosure may generally be implemented under the control of the CPU 382 by executing computer instruction code stored in the memory 384 (or in memory of a particular process chamber) as, e.g., a computer program product or software routine. That is, the computer program product is tangibly embodied on the memory 384 (or non-transitory computer-readable medium or machine-readable storage device). When the computer instruction code is executed by the CPU 382, the CPU 382 controls the chambers to perform operations in accordance with the various implementations.

The system controller 380 is configured to perform methods such as the method 100 stored in the memory 384.

In some embodiments, the first process chamber 302 includes an oxygen source 332 that is fluidly coupled to a processing region 340 of the first process chamber 302, wherein the oxygen source 332 is configured to deliver an oxygen-containing gas to the processing region 340. The first process chamber 302 may further include a first flow control valve 333 that is configured to control the flow of oxygen-containing gas provided from the oxygen source 332 to the processing region 340. In some embodiments, the first process chamber 302 further includes a hydrogen source 334 that is fluidly coupled to the processing region 340 of the first process chamber 302, wherein the hydrogen source 334 is configured to deliver a hydrogen-containing gas to the processing region 340. The first process chamber 302 may further include a second flow control valve 335 that is configured to control the flow of the hydrogen-containing gas provided from the hydrogen source 334 to the processing region 340. The first process chamber 302 may further include an etching gas source 336 that is fluidly coupled to the processing region 340 of the first process chamber 302, wherein the etching gas source 336 is configured to deliver an etching gas to the processing region 340. The first process chamber 302 may further include a third flow control valve 337 that is configured to control the flow of the etching gas provided from the etching gas source 336 to the processing region 340. The first process chamber 302 may further include an inductively coupled plasma source 338 that is configured to generate a plasma in the processing region 340, wherein the plasma comprises the hydrogen-containing gas and the oxygen-containing gas.

In some embodiments, the system controller 380 is configured to control the first flow control valve 333 so that an amount of oxygen-containing gas provided to a surface of a substrate, disposed in the processing region 340 of the first processing chamber 302, to preferentially oxidize one or more tungsten-containing layers disposed on a field region and sidewalls of features formed in the substrate by generating the plasma in the processing region 340 of first process chamber 302; control the third flow control valve 337 so that an amount of etching gas provided to the surface of the substrate preferentially etches the preferentially oxidized portions of the one or more tungsten-containing layers disposed on the field region and sidewalls of features formed in the substrate to be performed in the first process chamber 302; and control the first flow control valve 333 and the second flow control valve 335 to deliver an amount of the oxygen-containing gas and the hydrogen-containing gas to the processing region 340 to expose the one or more tungsten-containing layers to the post-etch treatment process comprises exposing the tungsten-containing layers to a hydrogen and oxygen plasma treatment process by generating an inductive coupled plasma comprising the oxygen-containing gas and the hydrogen-containing gas.

In some embodiments, XPS analysis comparing impurity levels on a tungsten surface treated with the oxidation/etchback/post-etch treatment described herein indicated a reduction in fluorine % from 4.1% after etchback to 0.3% after post-etch treatment, a reduction in nitrogen % from 8.0% after etchback to 0.9% after post-etch treatment, and a reduction in boron % from 0.8% after etchback to 0.4% after post-etch treatment.

The previously described embodiments of the present disclosure have many advantages, including the method utilizes an inductively coupled plasma (ICP) $O_2$ plasma that includes a diffusion limited gas flow within features (e.g., trenches or vias) formed on a substrate to create an oxygen-starved reaction. In some embodiments, use of an ICP $O_2$ plasma, a low weak energy $O_2$ plasma with high ion/radical ratio, is created to enhance oxidation in the field region and deplete the reactive oxygen species before reaching the bottom of a trench structure or gap. This provides good selectivity (>7) in the feature and top-field metal removal is achieved while seed material remains on the sidewall surfaces and the bottom surface of the features for a metal gap-fill. The methods enable multi-cycling capability with high wafer throughput. The methods overcome the challenges of seam and voids during metal gap-fill by removing field metal while maintaining the seeding metal at the bottom of the gap or trenches. In addition, the post-etch treatment process removes contaminants such as fluorine, boron, and/or nitrogen from surface of the tungsten-containing layer while reducing tungsten oxides to tungsten. This way, a seam-free bottom-up metal gap-fill can be performed. However, the present disclosure does not require that all the advantageous features and all the advantages need to be incorporated into every embodiment of the present disclosure.

While the foregoing is directed to embodiments of the present disclosure, other and further embodiments of the disclosure may be devised without departing from the basic scope thereof, and the scope thereof is determined by the claims that follow.

The invention claimed is:

1. A method of filling a feature on a substrate, comprising:
    performing a gradient oxidation process to oxidize exposed portions of a tungsten-containing liner layer, thereby forming tungsten oxide on the tungsten-containing liner layer,
        wherein the gradient oxidation process preferentially oxidizes an overhang portion of the tungsten-containing liner layer, which obstructs or blocks top openings of one or more features formed within a field region of a substrate;
    performing an etchback process to reduce the oxidized overhang portion of the tungsten-containing liner layer;
    exposing the tungsten-containing liner layer to a chemical vapor transport (CVT) process to remove the tungsten oxide remaining on the tungsten-containing liner layer, wherein the CVT process comprises exposing the tungsten-containing liner layer to an inductively coupled plasma (ICP) comprising hydrogen and oxygen; and
    performing a tungsten gap-fill process to fill or partially fill the one or more features.

2. The method of claim 1, wherein the CVT process reduces the tungsten oxide to tungsten.

3. The method of claim 1, wherein exposing the tungsten-containing liner layer to the ICP is performed at a temperature of 400 degrees Celsius or less and comprises supplying a processing gas comprising greater than or equal to 90% of hydrogen gas of a total flow of hydrogen gas and oxygen gas.

4. The method of claim 3, wherein performing the gradient oxidation process, performing the etchback process, and exposing the tungsten-containing liner layer to the CVT process are performed in a processing chamber without breaking vacuum.

5. The method of claim 4, wherein the one or more features comprise a bottom surface and at least one sidewall and the tungsten-containing liner layer is formed over the at least one sidewall and the bottom surface.

6. A method of filling a feature formed on a substrate, comprising:
    depositing one or more tungsten-containing layers over a surface of a substrate, wherein
        the substrate comprises one or more features formed within a field region of the surface of the substrate,
        each of the one or more features comprises a sidewall surface and a bottom surface, and
        the one or more tungsten-containing layers are formed over the field region, the sidewall surface, and the bottom surface of the one or more features;

exposing the surface of the substrate to a gradient oxidizing process, wherein the gradient oxidizing process forms preferentially oxidized regions of the tungsten-containing layers that are disposed over the field region of the one or more features;

preferentially etching the preferentially oxidized regions of the one or more tungsten-containing layers formed on the surface of the substrate, wherein, after performing the process of preferentially etching the preferentially oxidized regions, a first portion of the one or more tungsten-containing layers remains on the bottom surface of each of the one or more features and a second portion of the one or more tungsten-containing layers remains on the sidewall surface of each of the one or more features;

exposing at least the second portion of the one or more tungsten-containing layers to a post-etch treatment process to reduce oxidized tungsten to tungsten and remove contaminants from surfaces of the one or more tungsten-containing layers, wherein the post-etch treatment process comprises exposing the tungsten-containing layers to a hydrogen and oxygen inductively coupled plasma treatment; and filling the one or more features with a second tungsten layer, wherein the process of filling the one or more features with the second tungsten layer comprises preferentially growing the second tungsten layer from the second portion of the one or more tungsten-containing layers on the sidewall surface and the first portion of the one or more tungsten-containing layers that remain on the bottom surface of each of the one or more features.

7. The method of claim 6, wherein the post-etch treatment process further comprises exposing the tungsten-containing layers to argon.

8. The method of claim 6, wherein the hydrogen and oxygen inductively coupled plasma treatment is performed at temperatures of 400 degrees Celsius or less and comprises supplying a processing gas comprising greater than or equal to 90% of hydrogen gas of a total flow of hydrogen gas and oxygen gas.

9. The method of claim 8, wherein the sidewall surface is defined by a dielectric material selected from silicon oxide, silicon nitride, silicon oxynitride, or a combination thereof.

10. The method of claim 9, wherein depositing the one or more tungsten-containing layers over the surface of the substrate, comprises:

depositing a tungsten liner layer over the one or more features via a physical vapor deposition process; and depositing a boron-tungsten nucleation layer over the tungsten liner layer via an atomic layer deposition (ALD) process.

11. The method of claim 10, wherein filling the one or more features with the second tungsten layer comprises a chemical vapor deposition (CVD) gap-fill process.

12. The method of claim 6, wherein exposing the surface of the substrate to the gradient oxidizing process, preferentially etching the preferentially oxidized regions of the one or more tungsten-containing layers formed on the surface of the substrate, and exposing at least the second portion of the one or more tungsten-containing layers to the post-etch treatment process are performed in a first process chamber disposed on a cluster tool.

13. A method of filling a feature formed on a substrate, comprising:

depositing one or more tungsten-containing layers over a surface of a substrate, wherein the substrate comprises one or more features formed within a field region of the surface of the substrate, each of the one or more features comprises a sidewall surface and a bottom surface, and the one or more tungsten-containing layers are formed over the field region, the sidewall surface, and the bottom surface of the one or more features;

exposing the surface of the substrate to a gradient oxidizing process, wherein the gradient oxidizing process forms preferentially oxidized regions of the tungsten-containing layers that are disposed over the field region of the one or more features;

preferentially etching the preferentially oxidized regions of the one or more tungsten-containing layers formed on the surface of the substrate, wherein, after performing the process of preferentially etching the preferentially oxidized regions, a first portion of the one or more tungsten-containing layers remains on the bottom surface of each of the one or more features and a second portion of the one or more tungsten-containing layers remains on the sidewall surface of each of the one or more features;

exposing at least the second portion of the one or more tungsten-containing layers to a post-etch treatment process to reduce oxidized tungsten to tungsten and remove contaminants from surfaces of the one or more tungsten-containing layers, wherein the post-etch treatment process comprises a chemical vapor transport (CVT) process, the CVT process comprising a volatilization process and a reduction process, and the volatilization process proceeds via the following reaction (I) $WO2+2H2O \rightarrow WO2\,(OH)\,2+H2$ and the reduction process proceeds via the following reaction (II) $WO2\,(OH)\,2+3H2 \rightarrow W+4H2O$; and filling the one or more features with a second tungsten layer, wherein the process of filling the one or more features with the second tungsten layer comprises preferentially growing the second tungsten layer from the second portion of the one or more tungsten-containing layers on the sidewall surface and the first portion of the one or more tungsten-containing layers that remain on the bottom surface of each of the one or more features.

14. The method of claim 13, wherein the gradient oxidation process, the etching, and the post-etch treatment process are performed in a processing chamber without breaking vacuum.

15. The method of any of claim 13, wherein the sidewall surface is defined by a dielectric material selected from silicon oxide, silicon nitride, silicon oxynitride, or a combination thereof.

16. The method of claim 15, wherein depositing the one or more tungsten-containing layers over the surface of the substrate, comprises:

depositing a tungsten liner layer over the one or more features via a physical vapor deposition process; and depositing a boron-tungsten nucleation layer over the tungsten liner layer via an atomic layer deposition (ALD) process.

17. The method of claim 16, wherein filling the one or more features with the second tungsten layer comprises a chemical vapor deposition (CVD) gap-fill process.

18. The method of claim 13, wherein exposing the surface of the substrate to the gradient oxidizing process, preferentially etching the preferentially oxidized regions of the one or more tungsten-containing layers formed on the surface of the substrate, and exposing at least the second portion of the one or more tungsten-containing layers to the post-etch treatment process are performed in a first process chamber disposed on a cluster tool.

19. The method of claim 13, wherein the volatilization process and the reduction process of the chemical vapor transport (CVT) process are performed cyclically to recover a conductive tungsten surface by removing surface contaminants comprising one or more of fluorine, boron, and nitrogen prior to filling the one or more features with the second tungsten layer.

20. The method of claim 19, wherein, after the etchback process and prior to filling the one or more features with the second tungsten layer, the post-etch treatment reduces impurity levels of the surface contaminants comprising one or more of fluorine, boron, and nitrogen on the tungsten-containing layers.

* * * * *